United States Patent [19]
Garnett

[11] Patent Number: 5,912,563
[45] Date of Patent: Jun. 15, 1999

[54] TRINARY SIGNAL APPARATUS AND METHOD

[75] Inventor: Paul Jeffrey Garnett, Newton-le-Willows, United Kingdom

[73] Assignee: Sun Microsystems, Inc., Mountain View, Calif.

[21] Appl. No.: 08/862,132

[22] Filed: May 22, 1997

[51] Int. Cl.$^6$ .................................................. H03K 19/00
[52] U.S. Cl. .............................................. 326/60; 326/62
[58] Field of Search ............................... 326/59, 60, 104, 326/105, 106, 62

[56] References Cited

U.S. PATENT DOCUMENTS

| | | | |
|---|---|---|---|
| 4,100,429 | 7/1978 | Adachi | 326/60 |
| 4,465,944 | 8/1984 | Shin | 326/60 |
| 4,631,428 | 12/1986 | Grimes | 326/59 |
| 5,714,892 | 2/1998 | Bowers et al. | 326/60 |

*Primary Examiner*—Jon Santamauro
*Assistant Examiner*—Don Phu Le
*Attorney, Agent, or Firm*—Blakely Sokoloff Taylor & Zafman

[57] ABSTRACT

Extended trinary signal apparatus includes window comparator logic having first and second inputs for first and second trinary input signals, wherein each the trinary input signal can be a high, low or mid state, and an output for outputting signals dependent on the states of the first and second trinary input signals. A switch, which is connected to one of the first and second inputs, can be selectively activated in one phase to set the one of the first and second inputs to a state other than the mid state and can be inactive in another phase. Control logic is responsive to output signals from the window comparator output during the one and the other phase to provide extended trinary decoding of the trinary input signals. In this manner ninth and tenth input combinations can be identified by detecting whether two inputs which show a mid state are electrically connected to each other or not, this being achieved by selectively pulling one of the inputs to a predetermined state and determining whether the other input follows or not. Trinary encoding can thus be extended to provide ten, rather than the conventional nine states from two inputs.

20 Claims, 4 Drawing Sheets

| VALUE | J | K | L | M | N | P | R |
|---|---|---|---|---|---|---|---|
| 0 | H | L | L | H | L | L | L |
| 1 | L | H | L | H | L | L | L |
| 2 | L | L | H | H | L | L | L |
| 3 | H | L | L | L | H | L | L |
| 4 | L | H | L | L | H | L | L |
| 5 | L | L | H | L | H | L | L |
| 6 | H | L | L | L | L | H | L |
| 7 | L | H | L | L | L | H | L |
| 8 | L | L | H | L | L | H | L |
| 9 | L | H | L | L | H | L | H |

FIG. 6

TRINARY SIGNAL APPARATUS AND METHOD

BACKGROUND AND INTRODUCTION

This invention relates to trinary input devices and methods.

In many digital systems, different configurations are required, wherein the particular configuration needs to be sensed by the digital system. If a large number of configurations are required, a binary encoding may be used where the number of options available is $2^n$, wherein N is the number of pins used. As the name suggests, binary systems have only two possible values per pin (usually high and low).

In many cost sensitive applications. where each extra pin may cause a significant extra cost factor (for example encoding serial numbers into car alarm remote commanders), a three level (trinary or tri-state) encoding is used, where each pin has three possible values, namely high, low and mid. The electronic circuitry required to sense trinary levels is more complex than that required to sense binary levels. However, the extra complexity is insignificant when compared to the reduced packaging costs in adopting trinary encoding. Trinary encoding also provides many more options than binary encoding. For example, whereas four binary bits encodes sixteen possible values, four trinary bits encodes 81 possible values.

However, a disadvantage of conventional trinay encoding systems is that the encoding has a base of nine. This causes some difficulties for encoding as users are not used to working to base nine.

Accordingly, the invention seeks to provide an enhanced, or extended trinary encoding, which is more user friendly to use, as well as providing more options.

SUMMARY OF THE INVENTION

An object of the invention is to extend the versatility of trinary input devices and methods.

In accordance with a first aspect of the invention, there is provided a trinary signal apparatus comprising at least one extended trinary stage, the extended trinary stage comprising: window comparator logic having first and second inputs for first and second trinary input signals, where each trinary input signal can be a high, low or mid state, and an output for outputting signals dependent on the states of the first and second trinary input signals; a switch connected to one of the first and second inputs, wherein the switch can be selectively activated in one phase to set the one of the first and second inputs to a state other than the mid state and can be inactive in another phase; and control logic responsive to output signals from the window comparator output during the one and the other phase to provide extended trinary decoding of the trinary input signals.

In an embodiment of the invention, ninth and tenth input combinations can be identified by detecting whether two inputs which show a mid (open) state are electrically connected to each other or not, this being achieved by selectively pulling one of the inputs to a predetermined state and determining whether the other input follows or not. In this manner, it is possible to extend the principle of trinary encoding, to provide ten, rather than the conventional nine states.

Preferably the switch comprises a control input, the control logic being responsive to an output of the window comparator logic indicative of a mid state for the first and second inputs in the first phase to supply a control signal to the control input of the switch to activate the switch for a second phase.

Preferably, the switch, when activated, pulls the state at one of the first or second inputs towards a supply voltage representative of a high or low state. This provides for a simple circuit design which can be implemented at low cost.

In a preferred embodiment of the invention, the supply voltage is a low supply voltage representative of a low state and the switch, when activated, pulls the voltage at one of the inputs towards the low supply voltage.

Alternatively, the supply voltage can be a high supply voltage representative of a high state and the switch, when activated, can pull the voltage at one of the inputs towards the high supply voltage.

Preferably the switch is an active pull-up, or pull-down device, as appropriate, for example a switched transistor (e.g. a field effect transistor).

Preferably, the window comparator logic comprises a first window comparator for the first input and a second window comparator for the second input, wherein each comparator gives a first output signal if the input state of the input signal is below a first reference potential, a second output if the input state is between the first and a second reference potential and a third output if the input state is above a third reference potential.

As an extension to this, the window comparator logic can have further inputs, each for receiving respective further trinary input signals where each trinary input signal can have a high, low or mid value, and an output for outputting signals responsive to the trinary input signals, and a respective switch is connected to all but one of the inputs, wherein the switch can be selectively activated in one phase to set those inputs to a low state and can be inactive in another phase.

Alternatively, where the window comparator logic has further inputs each for receiving respective further trinary input signals and an output for outputting signals responsive to the input signals, a respective switch can be connected to all but one of the inputs, wherein the switch can be selectively activated in one phase to set those inputs to a high state and can be inactive in another phase.

The apparatus can further comprise one or more additional extended trinary stages, each additional extended trinary stage comprising: window comparator logic having respective first and second inputs for respective first and second trinary input signals and an output for outputting signals dependent on the states of the respective first and second trinary input signals; and a switch connected to one of the respective first and second inputs, wherein the switch can be selectively activated in one phase to set one of the respective first and second inputs to a state other than the mid state and can be inactive in another phase. In this manner, apparatus according to this embodiment of the invention can encode any number in base ten, with each order of magnitude being provided by a pair of inputs.

Each additional extended trinary stage can further comprise control logic responsive to output signals from the window comparator logic output during the one and the other phase to provide extended trinary decoding of the trinary input signals, the control logic being responsive to an output of the window comparator logic indicative of a mid state for the first and second inputs in the first phase to supply a control signal to the control input of the switch to activate the switch for a second phase In accordance with another aspect of the invention, there is provided trinary signal apparatus comprising: window comparator logic having first and second inputs for first and second trinary input signals and an output for output signal or signals dependent on the states of the first and second trinary input signals; an input device for selecting one of ten values, the input device being connected to the first and second inputs for supplying a trinary input signal to each of the first and second inputs, each trinary input signal having a high, low or mid state depending on the selected value; a switch connected to one of the first and second inputs, wherein the switch can be selectively activated in one phase to set the one of the first and second inputs to a state other than the mid state and can be inactive in another phase; and control logic responsive to output signals from the window comparator logic output during the one and the other phase to provide extended trinary decoding of the trinary input signals.

In accordance with a further aspect of the invention, there is provided a method of trinary encoding comprising steps of:

in a first phase, encoding first and second trinary input signals at each of first and second inputs, wherein each trinary input signal can have a high, low or mid state, to derive a first output encoding, and in a second phase, if the first output encoding is derived from a mid state for both of the inputs, pulling one of the first and second inputs to a state other than the mid state, determining whether the first and second inputs have both been pulled to the state other than the mid state and outputting a second output encoding dependent on the determination.

Preferably, the second phase is only initiated if the first output encoding is derived from a mid state for both of the inputs, the first output encoding being output otherwise. This enables a reduction in processing time and power consumption where the inputs do not both show the mid state.

DESCRIPTION OF THE DRAWINGS

Particular illustrative embodiments of the invention will be described hereinafter with reference to the accompanying drawings in which:

FIG. 6 is a table setting out possible inputs;

DESCRIPTION OF THE PREFERRED EMBODIMENT

As mentioned in the introduction, traditional trinary encoding using two signals provides nine possible values ($3^2$), where each trinary input has three values, namely high, low and mid.

Figure 1:
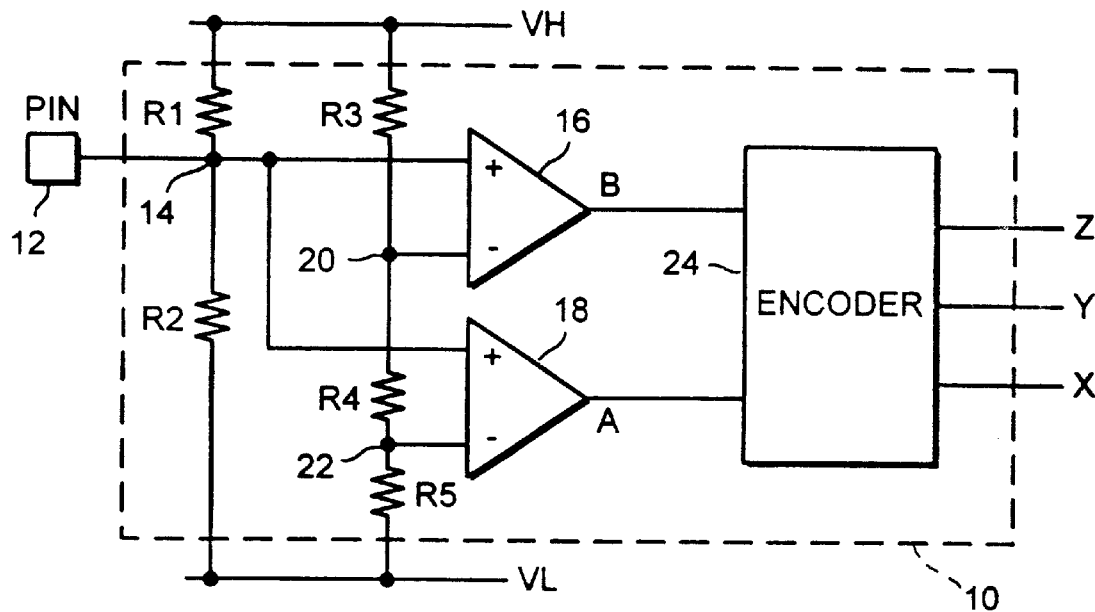
FIG. 1 is a schematic diagram of a basic window comparator circuit.

FIG. 1 illustrates a basic window comparator for a single pin for decoding a trinary input. In FIG. 1, a pin 12 is connected to a common point 14 between resistors R1 and R2, which form a voltage divider between a high voltage rail VH (e.g. 5 V) and a low voltage rail VL (e.g. 0 V). The common point 14 is also connected to one (+) input of each of first and second comparators 16 and 18. A second input (−) of the comparator 16 is connected to a first point 20 in a voltage divider chain formed from resistors R3, R4 and R5. this first point being located at the junction between resistors R3 and R4. Likewise. a second input (−) of the second comparator 18 is connected to a second point in the voltage divider chain at the junction 22 between the resistors R4 and R5. The output B of the first comparator 16 is supplied to one input of an encoder 24 with the output A of the second comparator being connected to a second input of the encoder 24. The encoder 24 can be implemented as a look-up table, or alternatively by logic circuitry or the like, to encode the values on lines A and B and thus provide an output on a respective one of lines X, Y or Z.

TABLE 1

| PIN | B | A | Z | Y | X |
|---|---|---|---|---|---|
| L | L | L | L | L | H |
| M | L | H | L | H | L |
| H | H | H | H | L | L |

Table 1 sets out the values, or states, for the pin 12, which can either be a low potential value (L), a mid — i.e. an intermediate potential value — (A or a high potential value (H). The respective outputs of the first and second comparators, 16 and 18, are given at B and A in Table 1, respectively. Accordingly, if the pin 12 is at a low value (L), then the outputs B and A are both L. This is encoded by the encoder 24 to give an output high (H) on the X output and a value low (L) on the Y and Z outputs.

Likewise, if the pin 12 is at a mid (M) state, then the outputs B and A of the first and second comparators are low (L) and high (H), respectively. This is encoded by the encoder 24 to provide a high output (H) on output Y and a low output (L) on outputs X and Z. A high (H) value on pin 12 causes the comparators 16 and 18 to output a high value (H) on each of the outputs B and A. The encoder encodes these values to give a high output (H) on the Z line, and a low output (L) on line X and Y.

In FIG. 1, the resistors R1 and R2 are set to be equal in order to force the pin to a mid value when left open. The resistors R3, R4 and R5 are set to be the same to provide a reference voltage to each of the comparators. In examples of the invention to be described later where a plurality of basic window comparators are provided, each of the window comparators could use the same resistors R3–R5.

Figure 2:
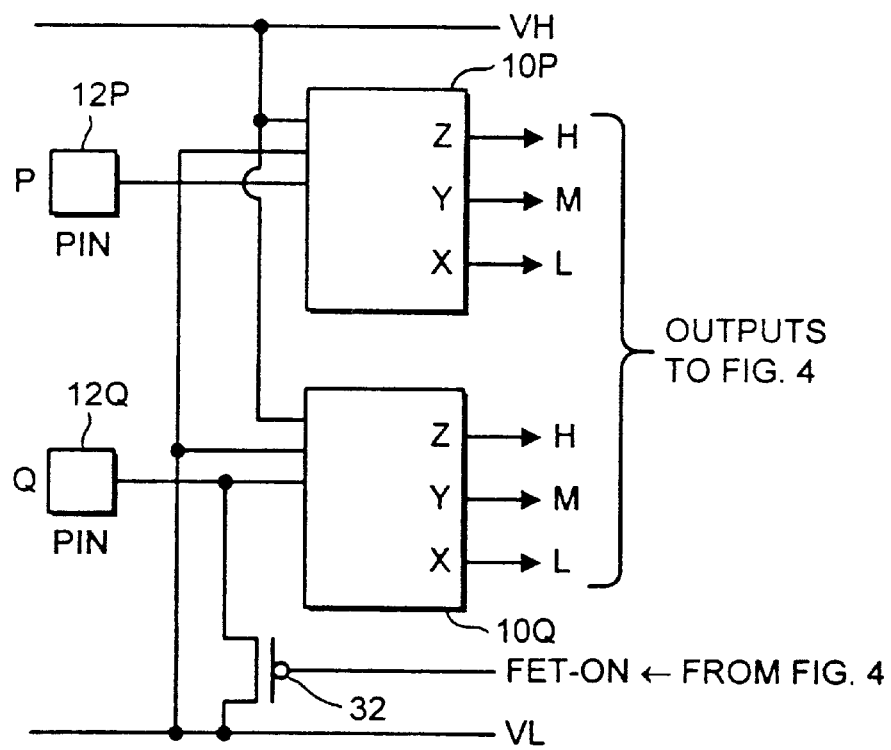
FIG. 2 illustrates an example of extended trinary decoding in accordance with an embodiment of the invention.

FIG. 2 illustrates a schematic overview of an extended trinary (trinary) apparatus having first and second pins 12P and 12Q. Each of the inputs 12P and 12Q is connected to a respective window comparator 10. Included within the window comparator 10 are the voltage divider chains comprising resistors R1, R2 and R3, R4, R5. The voltage divider R3–R5 could be provided in common for each of the window comparators, rather than being provided separately in each of those window comparators 10. In addition, as shown in FIG. 2, a FET is arranged as an active pull-down device for pin 12Q. Table 2 below illustrates one possible encoding for the values 0–9 for die trinary inputs provided at pins 12P and 12Q.

TABLE 2

| Encoding Value | Phase 1 P | Phase 1 Q | Phase 2 P | Phase 2 Q |
| --- | --- | --- | --- | --- |
| 0 | L | L | | |
| 1 | L | M | | |
| 2 | L | H | | |
| 3 | M | L | | |
| 4 | M | M | M | T |
| 5 | M | H | | |
| 6 | H | L | | |
| 7 | H | M | | |
| 8 | H | H | | |
| 9 | M | M | T | T |

In Table 2, the columns entitled Phase 1 relates to the input states detected in phase 1. the columns entitled Phase 2 relates to the input states detected in phase 2, P and Q relate to the input states of said trinary input signals, and T relates to a state other than M, in the present example the L state.

With the FET turned off (ic, so that pin 12Q is not pulled down to a low voltage level), the various combinations of states illustrated for values 0–8 in Table 1 can be obtained. However, when die state 4, that is a mid value (M) for both pins 12P and 12Q, is detected, the FET 32 can be turned on and the value at the outputs from each of the window comparators 10 is evaluated once more. If, on this occasion, the output from the window comparator 10P indicates a mid value (M) whereas the output from the window comparator 10Q shows a low value (L), this will indicate that the input pins 12P and 12Q are isolated from one another. If. however, the inputs 12P and 12Q are connected to each other, a low output (L) will be detected from each of the window comparators 10P and 10Q. It can therefore be seen that depending on the output in this second phase, a differentiation can be made between a value representative of 4 (for example, where the pins 12P and 12Q are isolated from one another) and a value representative of 9 (for example, where the pins 12P and 12Q are connected to one another) can be obtained.

Figure 3:
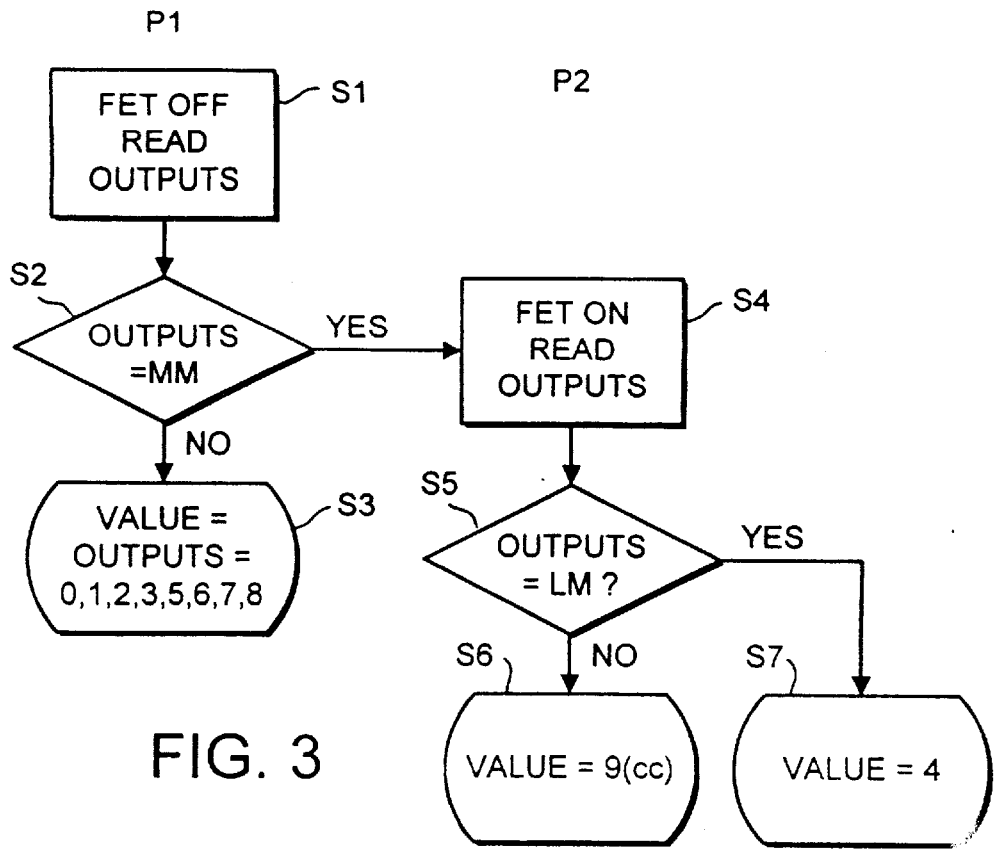
FIG. 3 is a diagrammatic representation of an example of extended trinary decoding in accordance with an embodiment of the invention.

FIG. 3 illustrates an algorithm for operating the trinary apparatus of FIG. 2. Accordingly, in a first phase P1, the FET is set to "OFF" and the outputs from the first and second window comparators are read in step S1. If, in step S2, it is determined that the output from the window comparators are not both mid value (MM), then a value from 0, 1, 2, 3, 5, 6, 7 or 8 is sct in accordance with Table 2 in step S3.

If, however, the outputs from the window comparators indicate that the trinary inputs are both mid value, or open (MM) in step S2, then a second phase P2 is initiated. In step S4. the FET is mrned "ON" and the outputs from the window comparators are read once more. If, now, the outputs are determined to be low (L) from window comparator 10Q and mid (M) from window comparator 10P, then it is determined that the value is 4 in step S7. If, however, the output from the comparators is other than low (L) for comparator 10P and mid (M) for comparator 12P then it is assumed that the outputs indicate low (L) and low (L) and a value 9 is attributed in step S6. The implementation of the various steps S1–S7 in FIG. 3 could be by means of software or by microcode incorporated in a microprocessor or microcontroller responsive to the outputs of the window comparators 10P and 10Q.

Figure 4:
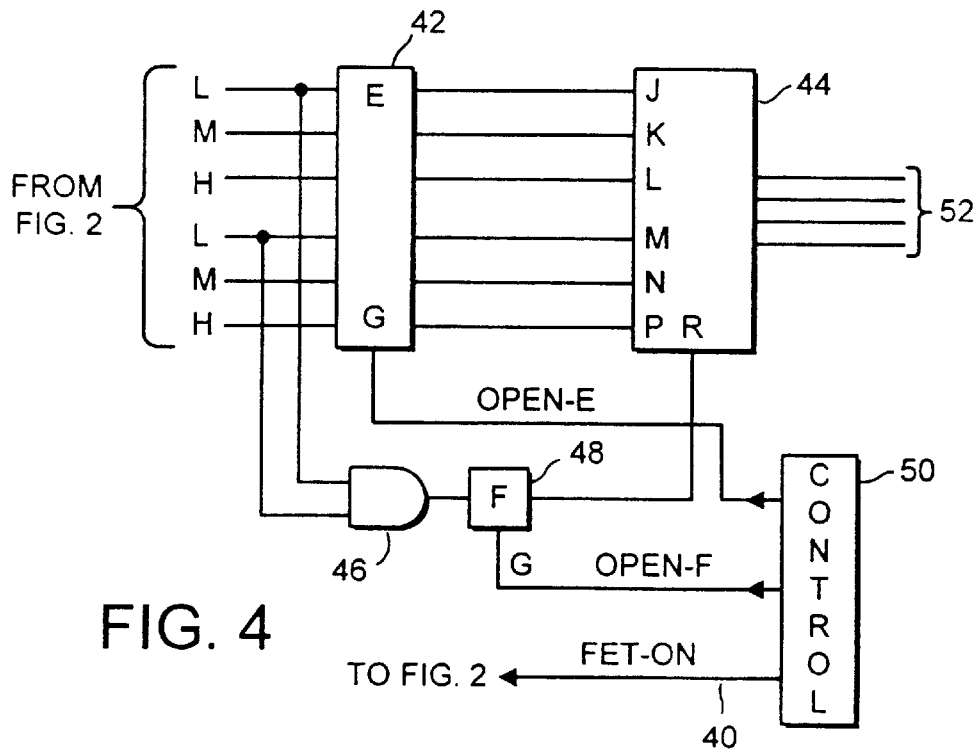
FIG. 4 is a schematic block diagram of, and an example of, hardware for implementing extended trinary decoding in accordance with an embodiment of the invention.
Figure 5:
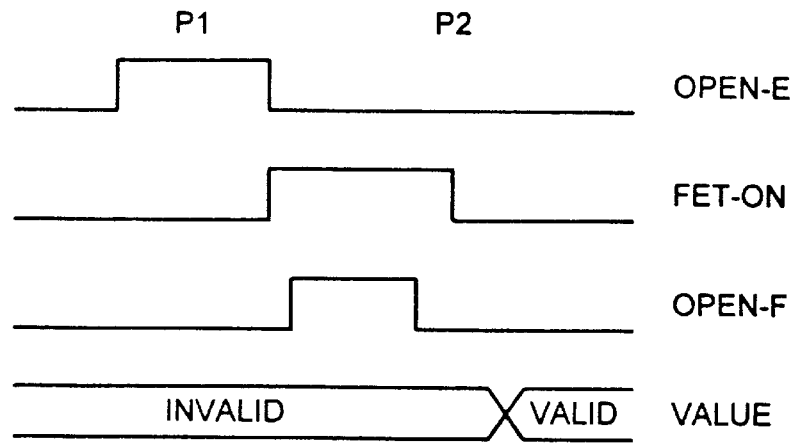
FIG. 5 is a timing diagram for explaining the operation of FIG. 4.

As an alternative. a hardware arrangement could be provided as illustrated in FIG. 4. In FIG. 4, a latch 'E' 42 and a latch 'F' 48 are open (transparent) when their input G is high and hold their value when input G is low. The control block 50 may be triggered by a reset signal or by power being applied to the device. It can be a clocked state machine or simply formed from delay elements. Its outputs are illustrated in FIG. 5. The effect of the hardware arrangement 40 shown in FIG. 4 is to implement the process illustrated in FIG. 3. In particular, in the first phase P1, the FET is off and the values output from the window comparators 10P and 10Q are passed via the latch 42. In the second phase P2, the FET is turned on, the value at the input of latch E is latched and the output of the low signals (L) from the window comparators 10P and 10Q are ANDed in an AND gate 46 and are passed by the latch 48 to an input R of an encoder 44. The table in FIG. 6 illustrates the content of the encoder 44, which is in the form of a look up table. or of suitable logic circuitry, for example. The resulting value, in the range 0–9 can then be output at 52 (for example as a binary coded value) based an the inputs to the look up table 44 in accordance with the content of the table in FIG. 6.

Figure 7:
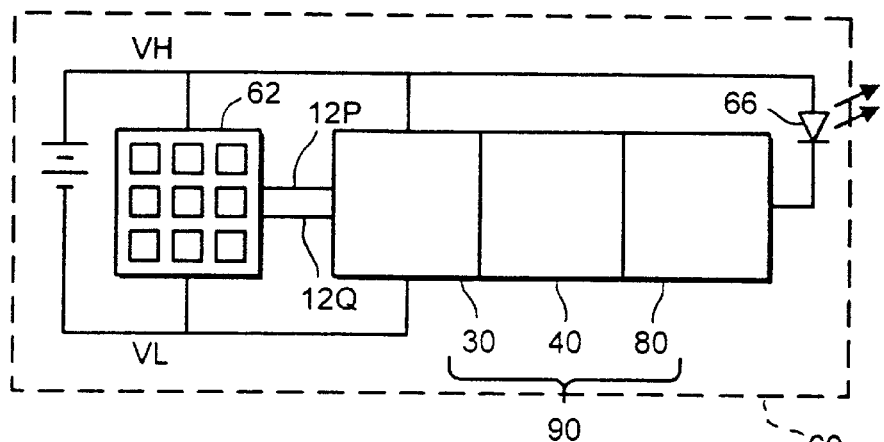
FIG. 7 is a schematic overview of a remote commander employing trinary input encoding.

FIG. 7 is a schematic illustration of one possible configuration for a trinary apparatus (in the particular example illustrated, an infrared remote commander 60) using an extended-trinary input decoder as illustrated in the preceding figures. The device 60 illustrated schematically in FIG. 7 comprises a high voltage rail VH (for example plus 5 volts) and a low voltage rail VL (for example zero volts). Connected between the high and low voltage rails is a key pad comprising nine keys, each of which is connected in a different configuration between the high and low voltage rails to establish separate trinary signals at 12P and 12Q. A tenth state is represented by no key being pressed. Trinary apparatus comprising the window comparators 10P and 10Q and the FET 32 are provided in a first block 30 and the controller described with reference co FIGS. 3–6 is provided in block 40. The output value shown at 52. for example in FIG. 3, is supplied to a conventional LED driver circuit (not shown) for driving an infra-red LED 66 to output appropriate coded signals for controlling apparatus to be controlled by the remote commander 60.

The effect of the keypad is to cause different connections of each of the pair of pins at 12P and 12Q to the high or low voltage rail VH or VL, bypassing the resistors R1 and R2 in FIG. 1. A direct connection to the high voltage rail VH shorting out the resistor R1 will set the pin 12 to a high state (H). A direct connection to the low voltage rail VL shorting out the resistor R2 will set the pin 12 to a low state (L). No bypass connection will leave the pin 12 in a mid state (M). When both pins are in the mid state and are not connected to each other the encoding of the value 4 as described above is provided. This will typically be represented by no key being pressed. A direct connection of the pin 12P to the pin 12Q, with both pins in the mid state will provide the encoding of the value 9 as described above.

The use of a keypad is but one possible example of an input device. Another example is a thumbwheel. Indeed, any other possible input device could be used. Indeed, simple jumpers could be used. As a further alternative, inputs could be achieved by hardwiring, for example for an embodiment of the invention where the trinary encoding is to provide an address encoding for a piece of equipment connected to a network for example. In such a case, various wired short circuits for resistors R1 and R2 for the respective window comparators could be provided and these short circuit connections be burnt out. or otherwise removed in order to achieve a desired encoding.

The functional blocks 30, 40 and 80 shown in FIG. 7, will typically be implemented on an integrated circuit 90, which could take the form of special purpose logic, a microcontroller, or a microprocessor according to a desired implementation. As well as input for the lines 12P and 12Q. inputs are provided for the high and low voltage rails VH and VL and for the outputs to the LED 66.

Accordingly, there has been described Tr encoding using two trinary signals providing nine possible values (with each trinary signal having one of three values high, low and mid) which are sensed by window comparators, and the output of which may be converted to binary by dedicated circuitry or software internal to a microprocessor, microcontroller, ASIC or the like. The extended trinary encoding described enables a pair of trinary input pins grouped together to provide ten possible encodings through the use of a pull-down device (for example a FET or other transistor or other switching device). It will be appreciated that, as an alternative to a pull-down device, a pull-up device where the signal is pulled up to the high voltage rail) could be provided instead. The encoding described herein therefore enables the providing of extended trinary encoding as set out in Table 1 above. With an embodiment of the invention for implementing extended trinary encoding as described herein. it is possible the define ten values from two input pins.

Whereas standard trinary encoding could not differentiate between codes 4 and 9 described herein, this is possible in an embodiment of the invention. In an embodiment of the invention, if both pins of a pair appear to be returning code 4 (i.e. both pins at a mid value), the active pull-down device is turned on and then, if both pins appear to be low, a code 9 is encoded on the pins rather than the code 4. Having determined whether or not both pins go low, the active pull-down device is then turned off.

It should be noted that one of the pins (the one with the active pull-down device) will go low whenever the active pull-down device is turned on. This could form a useful test feature.

Where the input has a pull-down device connected to a low impedance high value (eg, supply rail), damage to the active pull-down device could result (in addition to wasting power). This may be avoided by only turning on the active pull-down device, as described above, when the pin to which it is attached evaluates as in the mid state and when the active pull-down device is turned off. Indeed, the active pull-down device only needs to be turned on when both pins in a pair evaluate as being in the mid state.

Thus, evaluation of extended try inputs is a two-phase process in the particularly described embodiment in which, in a first phase, the active pull-down device is turned off, and a trinary value is captured and, in a second phase, the active pull-down device is turned on and a detection is made whether both pins are now low, and if so then the code is set to 9, otherwise the code is set to 4. It should be noted that the second phase is optional in the sense that it need not be formed unless both pins evaluate as being in the mid state. Alternatively, a small transistor could be used as the switching transistor so that it could only pass a limited current when switched ON.

As mentioned above, two pins are required to form an extended trinary pair, but the scheme is extensible in pairs of pins, each pair adding ten times more options or increasing the size of the value encoded by the same amount.

Figure 8:
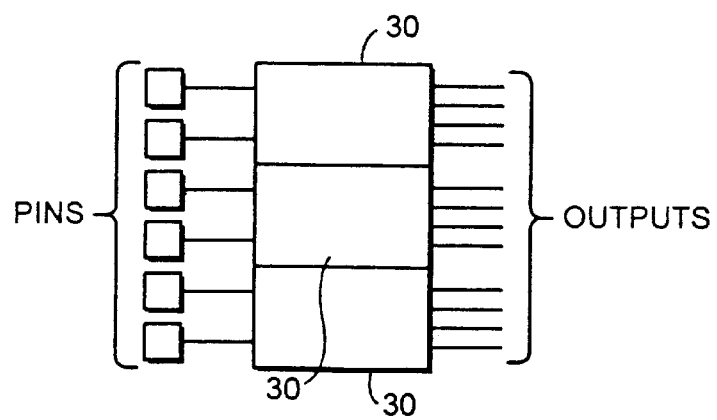
FIG. 8 is a schematic representation of a trinary encoding apparatus with six inputs.

FIG. 8 is a schematic illustration of an arrangement of a trinary encoding apparatus with six pins for receiving trinary inputs for providing an output value in the range 0–1000.

Other groupings of pins other that a pair-wise grouping are possible in other embodiments of the invention. For example, if three extended-trinary pins are available, 37 options can be provided. If four extended-trinary pins are available. 148 options can be provided. In such arrangements, all but the least significant pin needs a respective active pull-own device. An example is given for three extended-trinary pins in the following table (Table 3) although this idea could be further extended to four or more pins as mentioned above.

TABLE 3

| X | Y | Z | No of encodings | |
|---|---|---|---|---|
| L | L | L | | |
| L | L | M | | |
| L | L | H | | |
| L | M | L | | |
| L | M | M | | |
| — | — | — | 27 | Standard Trinary |
| — | — | — | | |
| H | H | L | | |
| H | H | M | | |
| H | H | H | | |
| [L, M, H] | C | C | 3 | Y and Z connected |
| C | [L, M, H] | C | 3 | X and Z connected |
| C | c | [L, M, H] | 3 | X and Y connected |
| C | C | C | 1 | |

There are many possible applications for trinary encoding apparatus according to the invention, for example for jumpers, switches, default PCB traces, to name but a few.

Although particular embodiments of the inventions have been described, it will be appreciated that the invention is not limited thereto, and many modifications and/or additions may be made within the spirit and scope of the invention as defined in the appended Claims. For example, different combinations of the features of the dependent Claims may be combined with the features of any of the independent Claims.

What is claimed is:

1. Trinary signal apparatus comprising at least one extended trinary stage, said extended Trinary stage comprising:
    window comparator logic having first and second inputs for first and second trinary input signals, where each said trinay input signal can be a high, low or mid state, and an output for outputting signals dependent on the states of said first and second trinary input signals;
    a switch connected to one of said first and second inputs, wherein said switch can be selectively activated in one phase to set said one of said first and second inputs to a state other than said mid state and can be inactive in another phase; and
    control logic responsive to output signals from said window comparator output during said one and said other phase to provide extended trinary decoding of said trinary input signals.

2. Apparatus according to claim 1, wherein said switch comprises a control input and wherein said control logic is responsive to an output of said window comparator logic indicative of a mid state for said first and second inputs in said first phase to supply a control signal to said control input of said switch to activate said switch for a said second phase.

3. Apparatus according to claim 1, wherein said switch, when activated, pulls the state at one of said first or second inputs towards a supply voltage representative of a said high or low state.

4. Apparatus according to claim 3, wherein said supply voltage is a low supply voltage representative of a said low state.

5. Apparatus according to claim 4, wherein said switch, when activated, pulls the voltage at one of said inputs towards said low supply voltage.

6. Apparatus according to claim 3, wherein said supply voltage is a high supply voltage representative of a said high state and said switch, when activated, pulls the voltage at one of said inputs towards said high supply voltage.

7. Apparatus according to claim 1, wherein said window comparator logic comprises a first window comparator for said first input and a second window comparator for said second input, wherein each comparator gives a first output signal if said input state of said input signal is below a first reference potential, a second output if said input state is between said first and a second reference potential and a third output if said input state is above a third reference potential.

8. Apparatus according to claim 5, wherein said window comparator logic has further inputs each for receiving respective further trinary input signals, wherein each said trinary input can have a high, low or mid state, and an output for outputting signals responsive to said urinary input signals; and
    a said switch is connected to all but one of said inputs, wherein each said switch can be selectively activated in one phase to set said all but one input to a low state and can be inactive in another phase.

9. Apparatus according to claim 6, wherein said window comparator logic has further inputs each for receiving respective further trinary input signals, wherein each said trinary input can have a high, low or mid state, and an output for outputting signals responsive to said trinary input signals; and
    a said switch is connected to all but one of said inputs, wherein each said switch can be selectively activated in one phase to set said all but one input to a high state and can be inactive in another phase.

10. Apparatus according to claim 1, further comprising one or more additional extended trinary stages, each additional extended trinary stage comprising:
    window comparator logic having respective first and second inputs for respective first and second trinary input signals and an output for outputting signals dependent on the states of said respective first and second trinary input signals; and
    a switch connected to one of said respective first and second inputs, wherein said switch can be selectively activated in one phase to set said one of said respective first and second inputs to a state other than said mid state and can be inactive in another phase.

11. Apparatus according to claim 10, wherein each additional extended trinary stage further comprises.
    control logic responsive to output signals from said window comparator logic output during said one and said other phase to provide extended trinary decoding of said trinary input signals, said control logic being responsive to an output of said window comparator logic indicative of a mid state for said first and second inputs in said first phase to supply a control signal to said control input of said switch to activate said switch for a said second phase.

12. Apparatus according to claim 1, wherein said switch is a switched transistor.

13. Apparatus according to claim 1 for encoding ten values from two trinary input signals.

14. Trinary signal apparatus comprising:
    window comparator logic having first and second inputs for first and second trinary input signals and an output for output signal or signals dependent on the states of said first and second trinary input signals;
    an input device for selecting one of ten values, said input device being connected to said fist and second inputs for supplying a trinary input signal to each of said first and second inputs, each trinary input signal having a high, low or mid state depending on the selected value;
    a switch connected to one of said first and second inputs, wherein said switch can be selectively activated in one phase to set said one of said first and second inputs to a state other than said mid state and can be inactive in another phase; and
    control logic responsive to output signals from said window comparator logic output during said one and said other phase to provide extended trinary decoding of said trinary input signals.

15. A method of trinary encoding comprising the steps of:
    in a first phase, encoding first and second trinary input signals at each of first and second inputs, wherein each said trinary input signal can have a high, low or mid state, to derive a first output encoding; and
    in a second phase, if said first output encoding is derived from a mid state for both of said inputs, pulling one of said first and second inputs to a state other than said mid state, determining whether said first and second inputs have both been pulled to said state other than said mid state and outputting a second output encoding dependent on said determination.

16. A method according to claim 15, wherein said second phase is only initiated if said first output encoding is derived from a mid state for both of said inputs, said first output encoding being output otherwise.

17. A method according to claim 15, comprising forming an output encoding having the following correspondence between low (L), mid (M) and high (H) states:

| Encoding Value | Phase 1 I1 | Phase 1 I2 | Phase 2 I1 | Phase 2 I2 |
|---|---|---|---|---|
| 0 | L | L | | |
| 1 | L | M | | |
| 2 | M | H | | |
| 3 | M | L | | |
| 4 | M | M | T | M |
| 5 | M | H | | |
| 6 | H | L | | |
| 7 | H | M | | |
| 8 | H | H | | |
| 9 | M | M | T | T | wherein the columns entitled Phase 1 relates to the input stales detected in phase 1, the columns entitled Phase 2 relates to the input states detected in phase 2, I1 and I2 relate to the states of said trinary input signals, and T relates to a state other than M.

18. A method according to claim 16, wherein the state T corresponds substantially to the state L.

19. A method according to claim 16, wherein the state T corresponds substantially to the state H.

20. A method according to claim 15, for encoding ten values from two trinary input signals.

* * * * *